(12) United States Patent
Belyansky et al.

(10) Patent No.: US 7,205,206 B2
(45) Date of Patent: Apr. 17, 2007

(54) METHOD OF FABRICATING MOBILITY ENHANCED CMOS DEVICES

(75) Inventors: Michael P. Belyansky, Bethel, CT (US); Bruce B. Doris, Brewster, NY (US); Oleg Gluschenkov, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/708,430

(22) Filed: Mar. 3, 2004

(65) Prior Publication Data

US 2005/0194699 A1    Sep. 8, 2005

(51) Int. Cl.
H01L 21/76    (2006.01)
(52) U.S. Cl. ............... 438/424; 438/199; 438/426; 438/435; 438/427; 257/21.546; 257/21.547
(58) Field of Classification Search ........... 438/199, 438/424, 426, 427, 435; 257/21.546, 21.547
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,910,572 A * | 3/1990 | Kameyama | 257/508 |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |
| 5,557,122 A | 9/1996 | Shrivastava et al. | |

(Continued)

FOREIGN PATENT DOCUMENTS

JP    64-76755    3/1989

OTHER PUBLICATIONS

Kern Rim, "Transconductance Enhancement in Deep Submicron Strained-Si n-MOSFETs", International Electron Devices Meeting, 26, 8, 1, IEEE, Sep. 1998.

(Continued)

*Primary Examiner*—Andy Huynh
(74) *Attorney, Agent, or Firm*—Joseph P. Abate; Greenblum & Bernstein, P.L.C.

(57) ABSTRACT

Compressive or tensile materials are selectively introduced beneath and in alignment with spacer areas and adjacent to channel areas of a semiconductor substrate to enhance or degrade electron and hole mobility in CMOS circuits. A process entails steps of creating dummy spacers, forming a dielectric mandrel (i.e., mask), removing the dummy spacers, etching recesses into the underlying semiconductor substrate, introducing a compressive or tensile material into a portion of each recess, and filling the remainder of each recess with substrate material.

41 Claims, 9 Drawing Sheets

U.S. PATENT DOCUMENTS

| | | | |
|---|---|---|---|
| 5,561,302 A | 10/1996 | Candelaria | |
| 5,565,697 A | 10/1996 | Asakawa et al. | |
| 5,571,741 A | 11/1996 | Leedy | |
| 5,592,007 A | 1/1997 | Leedy | |
| 5,592,018 A | 1/1997 | Leedy | |
| 5,670,798 A | 9/1997 | Schetzina | |
| 5,679,965 A | 10/1997 | Schetzina | |
| 5,683,934 A | 11/1997 | Candelaria | |
| 5,840,593 A | 11/1998 | Leedy | |
| 5,861,651 A | 1/1999 | Brasen et al. | |
| 5,880,040 A | 3/1999 | Sun et al. | |
| 5,940,716 A | 8/1999 | Jin et al. | |
| 5,940,736 A | 8/1999 | Brady et al. | |
| 5,946,559 A | 8/1999 | Leedy | |
| 5,960,297 A | 9/1999 | Saki | |
| 5,981,356 A | 11/1999 | Hsueh et al. | |
| 5,989,978 A | 11/1999 | Peidous | |
| 6,008,126 A | 12/1999 | Leedy | |
| 6,025,280 A | 2/2000 | Brady et al. | |
| 6,046,464 A | 4/2000 | Schetzina | |
| 6,066,545 A | 5/2000 | Doshi et al. | |
| 6,080,637 A | 6/2000 | Huang et al. | |
| 6,090,684 A | 7/2000 | Ishitsuka et al. | |
| 6,093,621 A | 7/2000 | Tseng | |
| 6,107,143 A | 8/2000 | Park et al. | |
| 6,111,292 A * | 8/2000 | Gardner et al. | 257/344 |
| 6,117,722 A | 9/2000 | Wuu et al. | |
| 6,133,071 A | 10/2000 | Nagai | |
| 6,165,383 A | 12/2000 | Chou | |
| 6,221,735 B1 | 4/2001 | Manley et al. | |
| 6,228,694 B1 | 5/2001 | Doyle et al. | |
| 6,246,095 B1 | 6/2001 | Brady et al. | |
| 6,255,169 B1 | 7/2001 | Li et al. | |
| 6,261,964 B1 | 7/2001 | Wu et al. | |
| 6,265,317 B1 | 7/2001 | Chiu et al. | |
| 6,274,444 B1 | 8/2001 | Wang | |
| 6,281,532 B1 | 8/2001 | Doyle et al. | |
| 6,284,623 B1 | 9/2001 | Zhang et al. | |
| 6,284,626 B1 | 9/2001 | Kim | |
| 6,297,117 B1 * | 10/2001 | Yu | 438/305 |
| 6,319,794 B1 | 11/2001 | Akatsu et al. | |
| 6,361,885 B1 | 3/2002 | Chou | |
| 6,362,082 B1 | 3/2002 | Doyle et al. | |
| 6,368,931 B1 | 4/2002 | Kuhn et al. | |
| 6,403,486 B1 | 6/2002 | Lou | |
| 6,403,975 B1 | 6/2002 | Brunner et al. | |
| 6,406,973 B1 | 6/2002 | Lee | |
| 6,461,936 B1 | 10/2002 | von Ehrenwall | |
| 6,476,462 B2 | 11/2002 | Shimizu et al. | |
| 6,483,171 B1 | 11/2002 | Forbes et al. | |
| 6,493,497 B1 | 12/2002 | Ramdani et al. | |
| 6,498,358 B1 | 12/2002 | Lach et al. | |
| 6,501,121 B1 | 12/2002 | Yu et al. | |
| 6,506,652 B2 | 1/2003 | Jan et al. | |
| 6,509,618 B2 | 1/2003 | Jan et al. | |
| 6,521,964 B1 | 2/2003 | Jan et al. | |
| 6,531,369 B1 | 3/2003 | Ozkan et al. | |
| 6,531,740 B2 | 3/2003 | Bosco et al. | |
| 6,563,152 B2 * | 5/2003 | Roberds et al. | 257/288 |
| 6,583,060 B2 | 6/2003 | Trivedi | |
| 6,621,131 B2 * | 9/2003 | Murthy et al. | 257/408 |
| 6,717,216 B1 | 4/2004 | Doris et al. | |
| 6,825,529 B2 | 11/2004 | Chidambarrao et al. | |
| 6,831,292 B2 | 12/2004 | Currie et al. | |
| 6,974,981 B2 | 12/2005 | Chidambarrao et al. | |
| 6,977,194 B2 | 12/2005 | Belyansky et al. | |
| 7,015,082 B2 | 3/2006 | Doris et al. | |
| 2001/0009784 A1 | 7/2001 | Ma et al. | |
| 2002/0063292 A1 | 5/2002 | Armstrong et al. | |
| 2002/0074598 A1 | 6/2002 | Doyle et al. | |
| 2002/0086472 A1 | 7/2002 | Roberds et al. | |
| 2002/0086497 A1 | 7/2002 | Kwok | |
| 2002/0090791 A1 | 7/2002 | Doyle et al. | |
| 2003/0032261 A1 | 2/2003 | Yeh et al. | |
| 2003/0040158 A1 | 2/2003 | Saitoh | |
| 2003/0057184 A1 | 3/2003 | Yu et al. | |
| 2003/0067035 A1 | 4/2003 | Tews et al. | |
| 2004/0238914 A1 | 12/2004 | Deshpande et al. | |
| 2004/0262784 A1 | 12/2004 | Doris et al. | |
| 2005/0040460 A1 | 2/2005 | Chidambarrao et al. | |
| 2005/0082522 A1 * | 4/2005 | Huang et al. | 257/19 |
| 2005/0082634 A1 | 4/2005 | Doris et al. | |
| 2005/0093030 A1 | 5/2005 | Doris et al. | |
| 2005/0098829 A1 | 5/2005 | Doris et al. | |
| 2005/0106792 A1 * | 5/2005 | Cea et al. | 438/197 |
| 2005/0106799 A1 | 5/2005 | Doris et al. | |
| 2005/0145954 A1 | 7/2005 | Zhu et al. | |
| 2005/0148146 A1 | 7/2005 | Doris et al. | |
| 2005/0194699 A1 | 9/2005 | Belyansky et al. | |
| 2005/0236668 A1 | 10/2005 | Zhu et al. | |
| 2005/0245017 A1 | 11/2005 | Belyansky et al. | |
| 2005/0280051 A1 | 12/2005 | Chidambarrao et al. | |
| 2005/0282325 A1 | 12/2005 | Belyansky et al. | |
| 2006/0027868 A1 | 2/2006 | Doris et al. | |
| 2006/0057787 A1 | 3/2006 | Doris et al. | |
| 2006/0060925 A1 | 3/2006 | Doris et al. | |

OTHER PUBLICATIONS

Kern Rim, et al., "Characteristics and Device Design of Sub-100 nm Strained Si N- and PMOSFETs", 2002 Symposium On VLSI Technology Digest of Technical Papers, IEEE, pp. 98-99.

Gregory Scott, et al., "NMOS Drive Current Reduction Caused by Transistor Layout and Trench Isolation Induced Stress", International Electron Devices Meeting, 34.4.1, IEEE, Sep. 1999.

F. Ootsuka, et al., "A Highly Dense, High-Performance 130nm node CMOS Technology for Large Scale System-on-a-Chip Application", International Electron Devices Meeting, 23.5.1, IEEE, Apr. 2000.

Shinya Ito, et al., "Mechanical Stress Effect of Etch-Stop Nitride and its Impact on Deep Submicron Transistor Design", International Electron Devices Meeting, 10.7.1, IEEE, Apr. 2000.

A. Shimizu, et al., "Local Mechanical-Stress Control (LMC): A New Technique for CMOS-Performance Enhancement", International Electron Devices Meeting, IEEE, Mar. 2001.

K. Ota, et al., "Novel Locally Strained Channel Technique for high Performance 55nm CMOS", International Electron Devices Meeting, 2.2.1, IEEE, Feb. 2002.

G. Zhang, et al., "A New 'Mixed-Mode'Reliability Degradation Mechanism in Advanced Si and SiGe Bipolar Transistors." IEEE Transactions on Electron Devices, vol. 49, No. 12, Dec. 2002, pp. 2151-56.

H.S. Momose, et al., "Temperature Dependance of Emitter-Base Reverse Stress Degradation and its Mechanism Analyzed by MOS Structures."1989 IEEE, Paper 6.2, pp. 140-143.

C.J. Huang, et al., "Temperature Dependence and Post-Stress Recovery of Hot Electron Degradation Effects in Bipolar Transistors." IEEE 1991, Bipolar Circuits Technology Meeting 7.5, pp. 170-173.

S.R. Sheng, et al., "Degradation and Recovery of SiGe HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003, IEEE GaAs Digest, pp. 263-66.

H. Wurzer, et al., "Annealing of Degraded non-Transistors-Mechanisms and Modeling." IEEE Transactions on Electron Devices, vol. 41, No. 4, Apr. 1994, pp. 533-38.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al. "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Fmax/Ft - 350/300 GHz and Gate Delay Below 3.3 ps". 2004 IEEE, 4 pages.

J.C. Bean, et al., "GEx SI 1 x/Si Strained-Layer Superlattice Grown by Molecular Beam Epitaxy". J. Vac. Sci. Technol. A 2(2), Apr.-Jun. 1984, pp. 436-440.

J.H. Van Der Merwe, "Regular Articals". Journal of Applied Physics, vol. 34, No. 1, Jan. 1963, pp. 117-122.

J.W. MAtthews, et al., "Defects in Epitaxial Multilayers". Journal of Crystal Growth 27 (1974), pp. 118-125.

Subramanian S. Iyer, et al. "Heterojunction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilbrium Critical Thickness for SI 1-x GEx Strained Layers on (100)Si". Appl. Phys. Lett. 56 (5), Jan. 29, 1990, pp. 460-462.

Q. Quyang et al., "Two-Dimensional Bandgap Engineering in a Novel Si/SiGe pMOSFET with Enhanced Device Performance and Scalability". 2000, IEEE, pp. 151-154.

* cited by examiner

METHOD OF FABRICATING MOBILITY ENHANCED CMOS DEVICES

BACKGROUND OF INVENTION

The invention generally relates to a semiconductor device and method of manufacture and, more particularly, to a stress enhanced complementary metal-oxide-semiconductor (CMOS) device and method of manufacture.

As semiconductor devices continue to evolve towards higher densities of circuit elements, the performance of materials used for the devices becomes more critical to overall performance, such as charge carrier mobility. One approach for enhancing performance involves imparting local mechanical stresses. In the case of a (100) Si surface orientation with current flow in the <110> direction, electron mobility and, thus, n-channel field effect transistor (nFET) performance, may be improved by imparting tensile stress along (i.e., parallel to) the direction of a current flow. Additionally, hole mobility and, thus, p-channel field effect transistor (pFET) performance, may be enhanced by imparting compressive stress parallel to the direction of current flow.

One approach for enhancing stress is to fabricate CMOS devices on substrates having a thin strained silicon (Si) layer on a relaxed SiGe buffer layer which exhibit substantially higher electron and hole mobility in strained Si layers than in bulk silicon layers. Furthermore, metal oxide semiconductor field effect transistors (MOSFETs) with strained Si channels exhibit enhanced device performance compared to devices fabricated in conventional (unstrained) silicon substrates. However, this traditional approach has several drawbacks. Specifically, no pFET improvement has been observed for Ge concentrations less than 30%. Furthermore, as Geconcentrations increase to a level required to enhance performance of p-channel field effect transistors, so does defect density. Dopant diffusion (e.g., of arsenic) is also problematic in SiGe layers and can lead to degraded short channel effects.

Another problem faced by conventional stress inducing techniques relates to achieving a balanced stress profile in the channel. Uneven stress profiles may result from non-uniform Ge distributions in SiGe layers, unevenly formed stress inducing films, and stress inducing structures that are unevenly spaced from a channel. Such irregularities are common occurrences that can diminish the beneficial effects of the stress inducing materials.

The invention is directed to overcoming one or more of the problems as set forth above.

SUMMARY OF INVENTION

In a first aspect of the invention, a method of forming a semiconductor structure is provided. The method entails forming a field effect transistor gate on a substrate. Then a mandrel layer is formed. Then spacer voids are formed between the gate and mandrel layer. Subsequently, recesses are created in the substrate below and in alignment with the spacer voids. A first portion of the recesses are filled with a stress imposing material. A second portion of the recesses are next filled with a semiconductor material. Then the mandrel layer is removed. The resulting structure includes stress inducing material in alignment with spacer locations and adjacent to a channel region for the gate.

In a second aspect of the invention, a method of forming a semiconductor structure is provided. The method entails forming dummy spacers on sides of a gate formed on a substrate. Next, a mandrel layer is formed with portions abutting the dummy spacers. After forming the mandrel layer, the dummy spacers are removed to form spacer voids between the gate and mandrel layer. Next, recesses are created in the substrate below and in alignment with the first spacer voids. A first portion of the recesses are then filled with a stress imposing material. Then, a second portion of the recesses are filled with a semiconductor material. Next the mandrel layer is removed.

In a third aspect of the invention, a method of forming a semiconductor structure with two types of field effect transistor devices is provided. The method entails forming first and second types of field effect transistor gate on a substrate. A first dummy spacer and a second dummy spacer are formed for each of the first type of field effect transistor gate and the second type of field effect transistor gate. The first dummy spacer is formed on a first side of each gate, and the second dummy spacer is formed on a second side of each gate opposite the first side. Next, a first mandrel layer is formed with portions abutting the dummy spacers for each type of gate.

After forming the mandrel layer, the second type of field effect transistor gate and the first and second dummy spacers for the second type of field effect transistor gate are all masked. The next several steps, as described below are performed on the first type of field effect transistor gate, which is now the unmasked field effect transistor gate.

The first and second dummy spacers are removed from the unmasked field effect transistor gate to form a first spacer void between the gate and the mandrel layer and a second spacer void between the gate and the mandrel layer for the unmasked field effect transistor gate. Next, a first recess is created in the substrate below and in alignment with the first spacer void for the unmasked field effect transistor gate. Then, a second recess is created in the substrate below and in alignment with the second spacer void for the unmasked field effect transistor gate. A first portion of the first recess and a first portion of the second recess for the unmasked field effect transistor gate are then filled with a stress material configured to enhance performance of the unmasked field effect transistor gate. Then, a second portion of the first recess and a second portion of the second recess for the unmasked field effect transistor gate are filled with a semiconductor material.

Subsequently, the second type of field effect transistor gate and the first and second dummy spacers for the second type of field effect transistor gate are all unmasked. Then, the first type of field effect transistor gate and areas of the substrate corresponding to the first type of field effect transistor gate are covered by a mandrel layer. The steps described in the preceding paragraph are then performed for the unmasked field effect transistor gate, which is now the second type of field effect transistor gate. After completing the steps, the first type of field effect transistor gate, the first and second dummy spacers for the first type of field effect transistor gate and areas of the substrate corresponding to the first type of field effect transistor gate are unmasked. The mandrel layer is then removed.

In a fourth aspect of the invention, a semiconductor structure is provided. The structure includes a substrate with a field effect transistor gate on the substrate. The gate has a first side and a second side. A first spacer is provided against a first side of the gate and a second spacer is provided against a second side of the gate. A first recess in the substrate, that is approximately directly below the first spacer, has a first side approximately in alignment with the first side of the gate. A second recess in the substrate, that is approximately directly below the second spacer, has a second side approximately in alignment with the second side of the gate. A stress imposing material fills a first portion of the first recess and a first portion of the second recess. A semiconductor material fills a second portion of the first recess and a second portion of the second recess.

DETAILED DESCRIPTION

The invention employs compressive or tensile imposing materials selectively introduced beneath and in alignment with spacer areas of a semiconductor substrate and adjacent to channel areas to enhance electron and hole mobility in CMOS circuits. An exemplary process in accordance with the invention entails steps of creating dummy spacers, forming a dielectric mandrel (i.e., mask), removing the dummy spacers, etching recesses into the underlying semiconductor substrate, introducing a compressive or tensile imposing material into a portion of each recess, and filling the remainder of each recess with substrate material.

Figure 1:
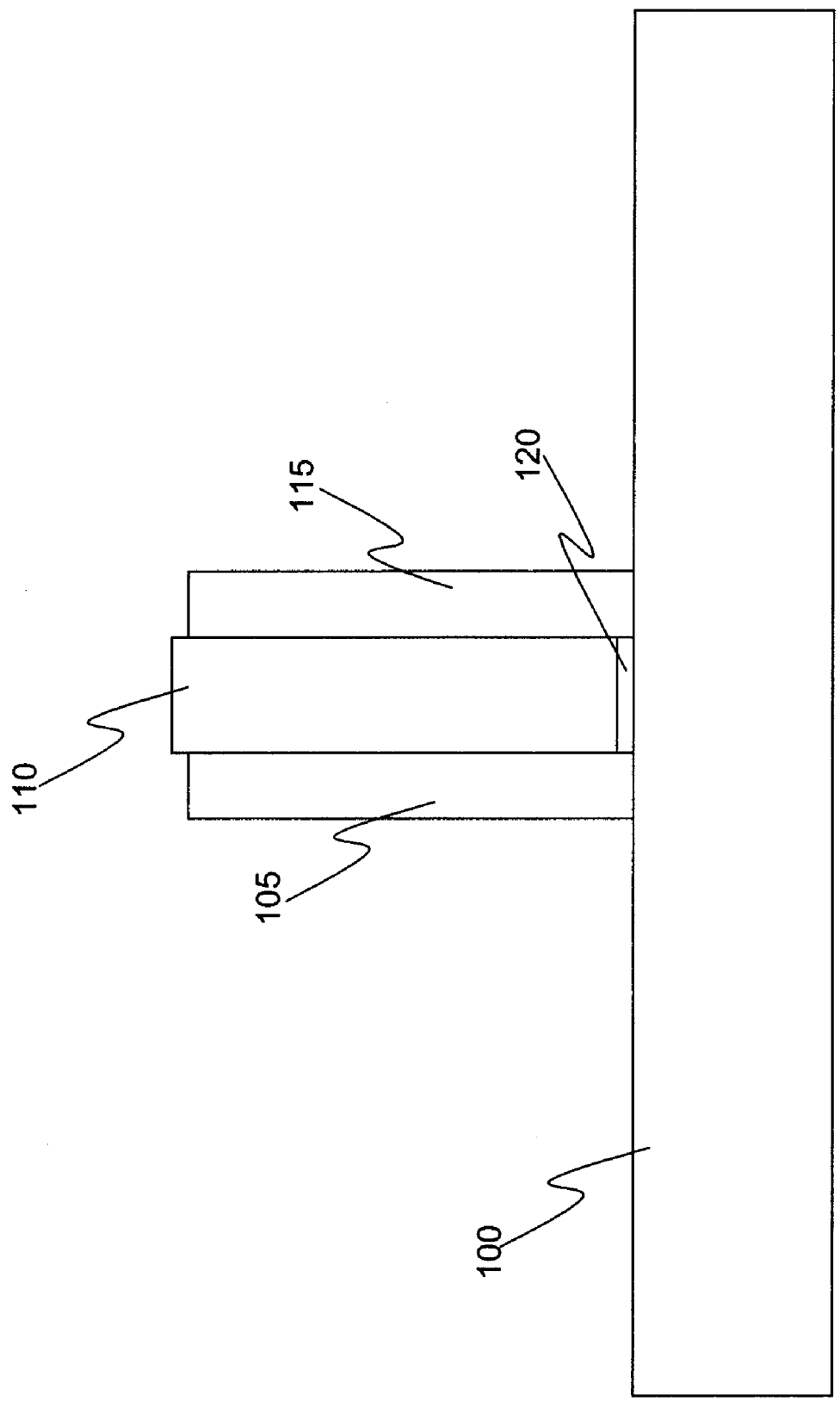
FIG. 1 shows a semiconductor structure including a gate, a gate dielectric layer and dummy spacers on a substrate.

Referring now to FIG. 1, an exemplary starting structure comprised of a substrate 100 having a patterned gate 110, with a gate dielectric layer 120 and disposable (i.e., dummy) spacers 105 and 115 is shown. The substrate is a semiconductor substrate such as a silicon or silicon-on-insulator wafer 100. Such wafers are commercially available starting substrates for various discrete and integrated circuit (IC) semiconductor device applications. The dummy spacers 105 and 115 are comprised of a disposable material such as a nitride ($Si_3N_4$) film formed at side walls of the gate 110. Alternatively, if, for example, the gate has a gate cap (i.e., a dielectric layer, for example, a silicon nitride layer, a silicon oxy-nitride layer, or other material layers having high etching selectivity to subsequently formed dielectric layers), then a thin $SiO_2$ liner may be deposited followed by deposition of a polysilicon film to form the dummy spacers 105 and 115. The dummy spacers may, for example, have a thickness of approximately 100 to 1000 Å. The formation of the dummy spacers 105 and 115 can be carried out in a conventional manner, such as by using a sacrificial nitride film process.

Those skilled in the art will appreciate that conventional process steps may be used to fabricate the structure shown in FIG. 1. A typical sequence may, for example, include first providing a semiconductor substrate 100. Next, an isolation scheme is used to isolate active devices (e.g., MOSFETs). The isolation of semiconductor devices fabricated on the substrate 100 may be performed using local oxidation of substrate ("LOCOS") isolation techniques in both bulk silicon substrate applications and silicon-on-insulator ("SOI") substrate applications, trench isolation such as shallow trench isolation techniques in bulk silicon substrate applications, and mesa isolation in SOI substrate applications.

Well implants, which include p-wells or n-wells, are formed in the structure, typically after formation of the isolation regions, utilizing, for example, conventional ion implantation and activation annealing processes. The ion dosage and implant energies may vary depending of the type of dopant to be implanted as well as the desired depth of the well implant. Moreover, the activation annealing temperatures and times employed may also vary. The well implants are used to set threshold voltages.

Next, gate oxidation followed by gate patterning may be performed in a conventional manner to form the gate stack 110 and 120. The dummy spacers are then fabricated by depositing a disposable dummy spacer material and, if necessary, performing a spacer etch. It should be noted that the specific steps of the standard process flow used to fabricate the structure shown in FIG. 1 are not critical to the invention.

Figure 2:
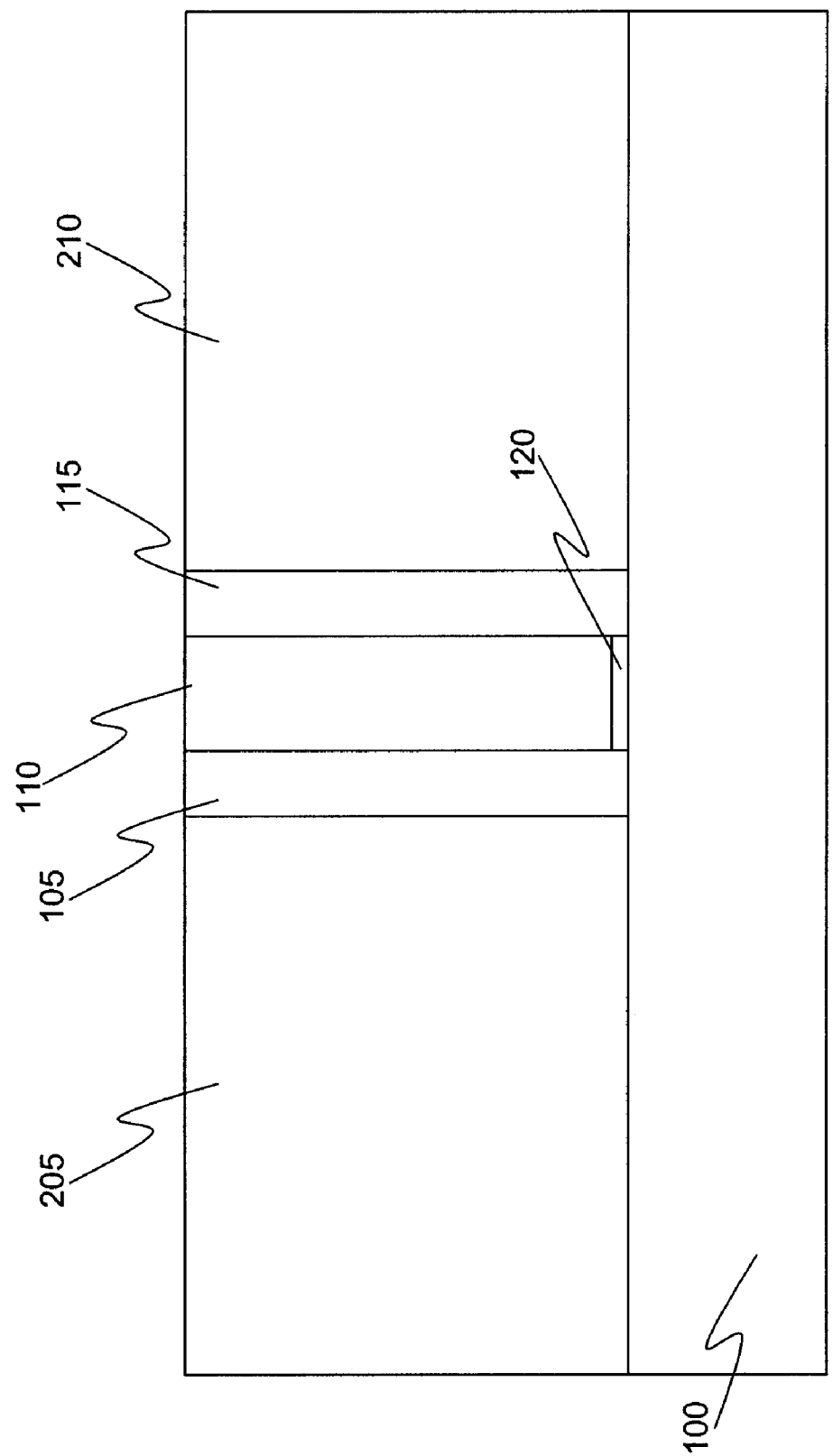
FIG. 2 shows the semiconductor structure of FIG. 1 with an added mandrel layer and a planarized surface.

Now referring to FIG. 2, a film is deposited and planarized to the top of the gate 110 to form a mandrel layer 205 and 210 over the active device region and abutting the dummy spacers 105 and 115. The mandrel layer 205 and 210 may be comprised of a dielectric film such as $SiO_2$ or a self-planarizing material (e.g., a spin-on polymer or oxide deposited in liquid form by reaction of methyl silane and hydrogen peroxide) that withstands etching of dummy spacers 105 and 115, as described below. Deposition may be performed using conventional deposition methods such as atmospheric pressure CVD, low pressure CVD (LPCVD) or plasma-enhanced CVD (PECVD). Planarization may be performed using chemical mechanical processing (CMP).

Figure 3:
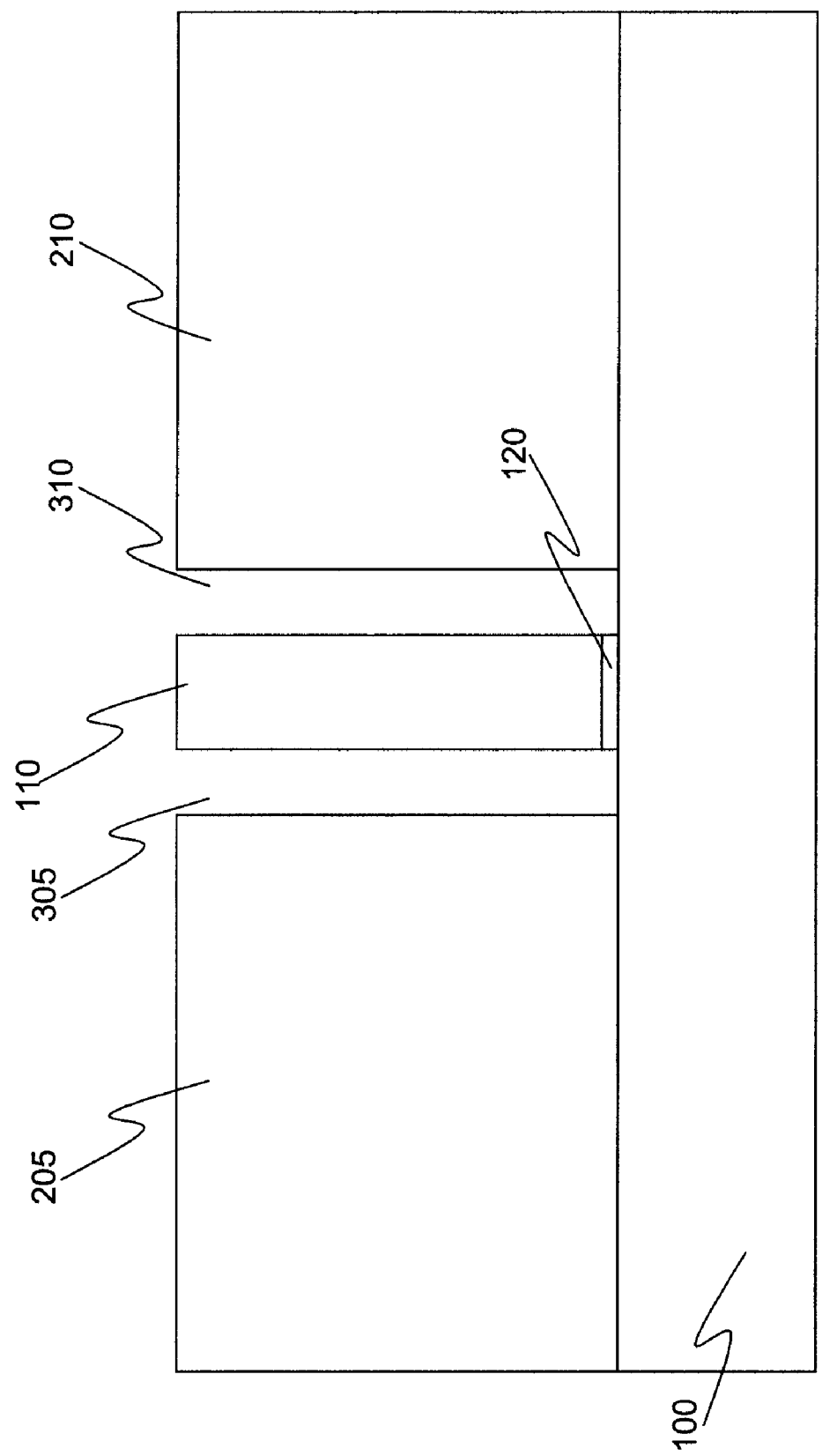
FIG. 3 shows the semiconductor structure of FIG. 2 with the dummy spacers removed to form voids.

After forming the mandrel layer 205 and 210, the dummy spacers 105 and 115 may be removed using a wet or dry (e.g., plasma assisted) etch process. If the dummy spacers 105 and 115 are comprised of $Si_3N_4$, then wet etching may be performed using concentrated hydrofluoric acid (HF), buffered HF or a boiling $H_3PO_4$ solution. If the dummy spacers 105 and 115 are comprised of polysilicon with an $SiO_2$ liner, then wet etching may be performed to remove the polysilicon using mixtures of nitric acid ($HNO_3$) and hydrofluoric acid (HF) in water or acetic acid ($CH_3COOH$), or using a mixture of potassium hydroxide (KOH) in water and isopropyl alcohol. After removing the polysilicon, wet etching may be performed to remove the $SiO_2$ liner using a dilute solution of HF with or without the addition of ammonium fluoride ($NH_4F$) for buffering. Removal of the dummy spacers 105 and 115 results in spacer voids 305 and 310 as shown in FIG. 3.

Figure 4:
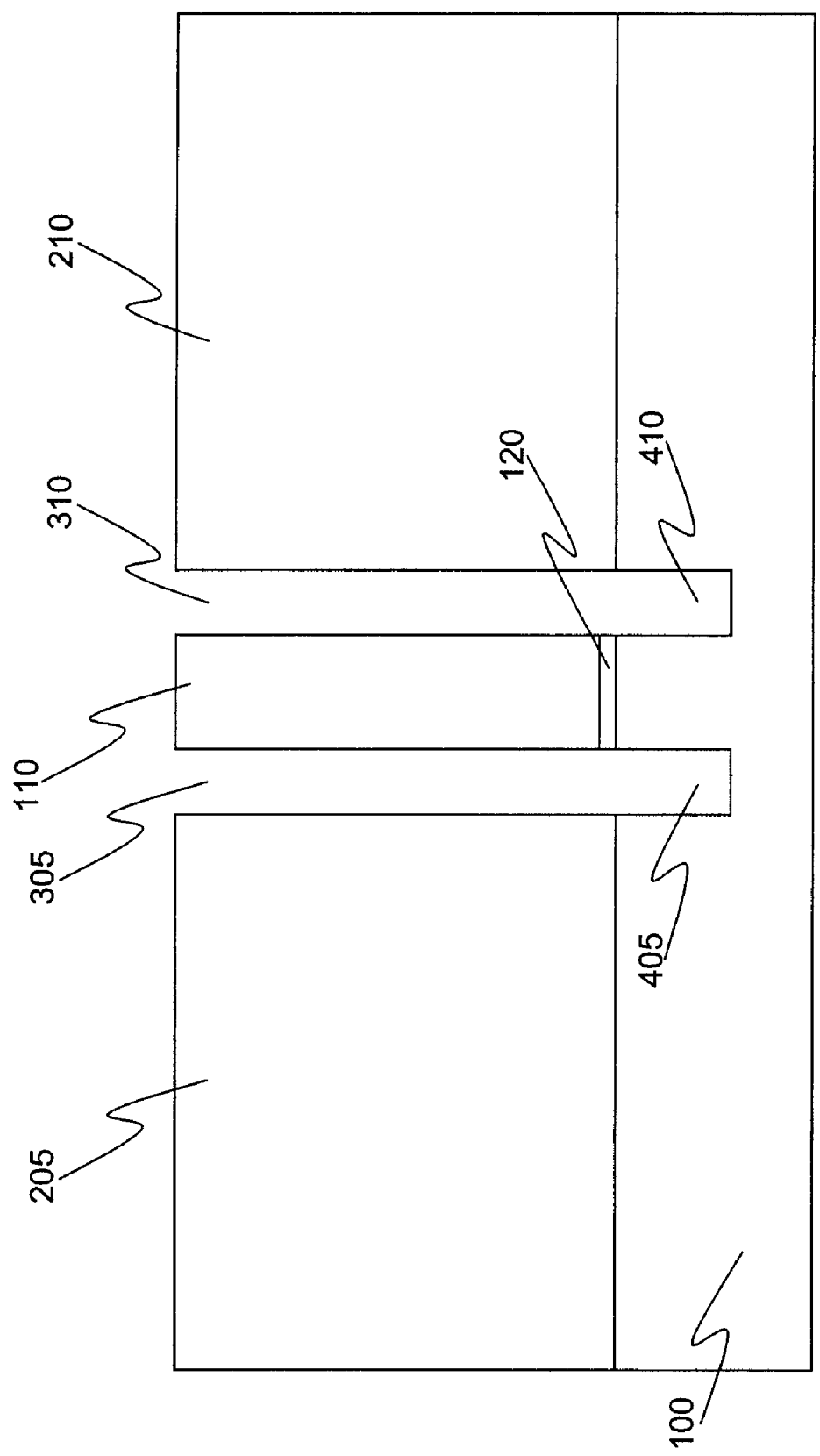
FIG. 4 shows the semiconductor structure of FIG. 3 with recesses in the substrate formed at the bottom of each void.

After removing the dummy spacers 105 and 115, the substrate (e.g., Si) is etched using a timed etch process to create recesses 405 and 410 at the bottom of the spacer voids 305 and 310 as shown in FIG. 4. The depth of the recesses 405 and 410 measured from the top surface of the substrate 100 may be approximately 500 to 2000 Å. The recesses 405 and 410, which will be partially filled with a stress inducing material, should extend below the channel region of the FET. In one embodiment, the depth of each recess 405 and 410 is such as to position the top surface of the stress inducing material slightly below the semiconducting channel region of the substrate 100 that will separate a highly conductive source and drain. The closer in proximity the stress inducing material is to the channel, the more pronounced the effect on mobility.

Figure 5:
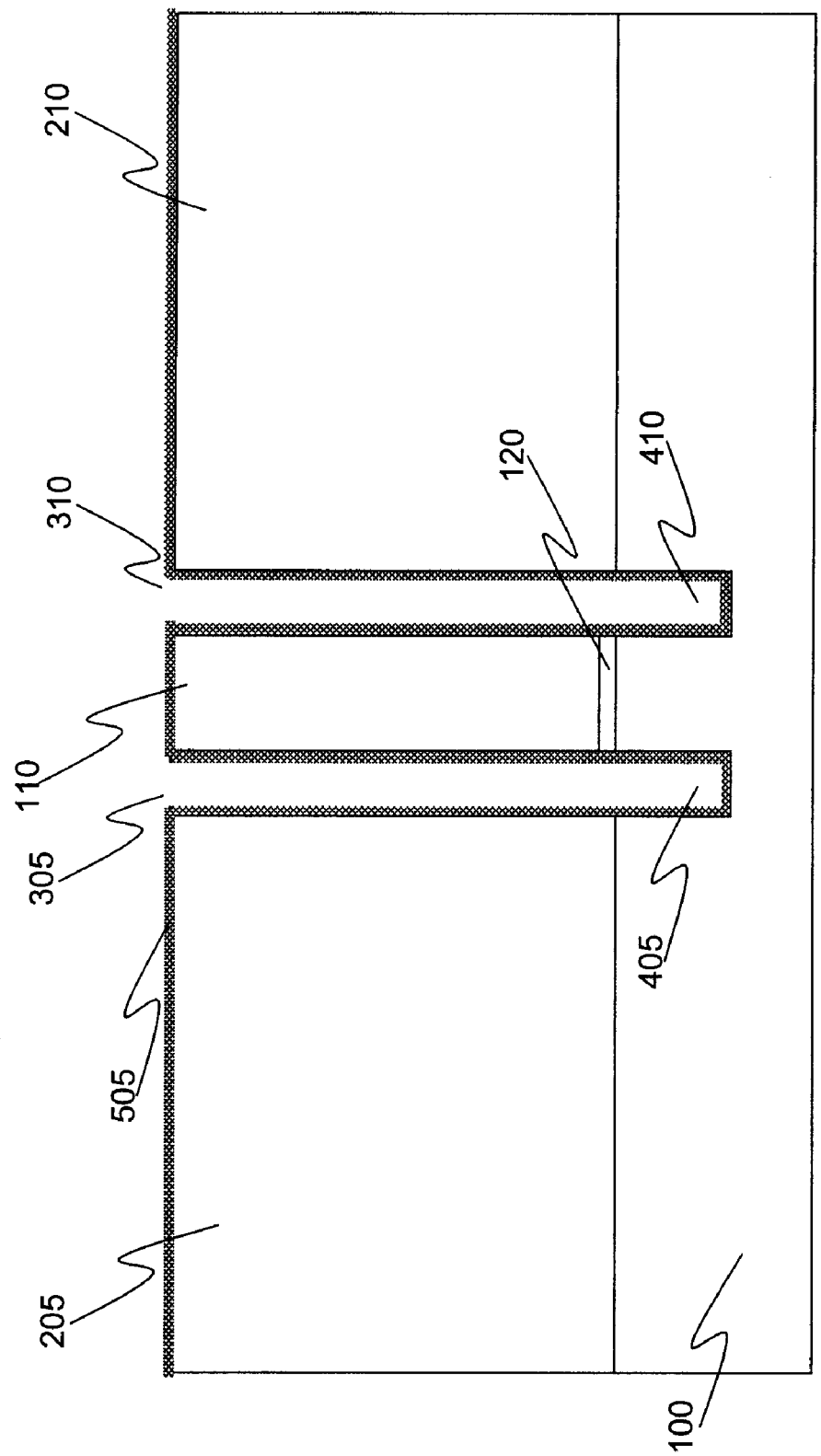
FIG. 5 shows the semiconductor structure of FIG. 4 with an added interfacial layer.

Next, a nitride interface (e.g., an $Si_3N_4$ film) 505 may be formed, including in recesses 405 and 410, as shown in FIG. 5. By way of example, the nitride interface may be formed using an intermediate temperature LPCVD process or a low-temperature plasma assisted CVD process. The nitride interface may serve as a selective etch stop film.

Figure 6:
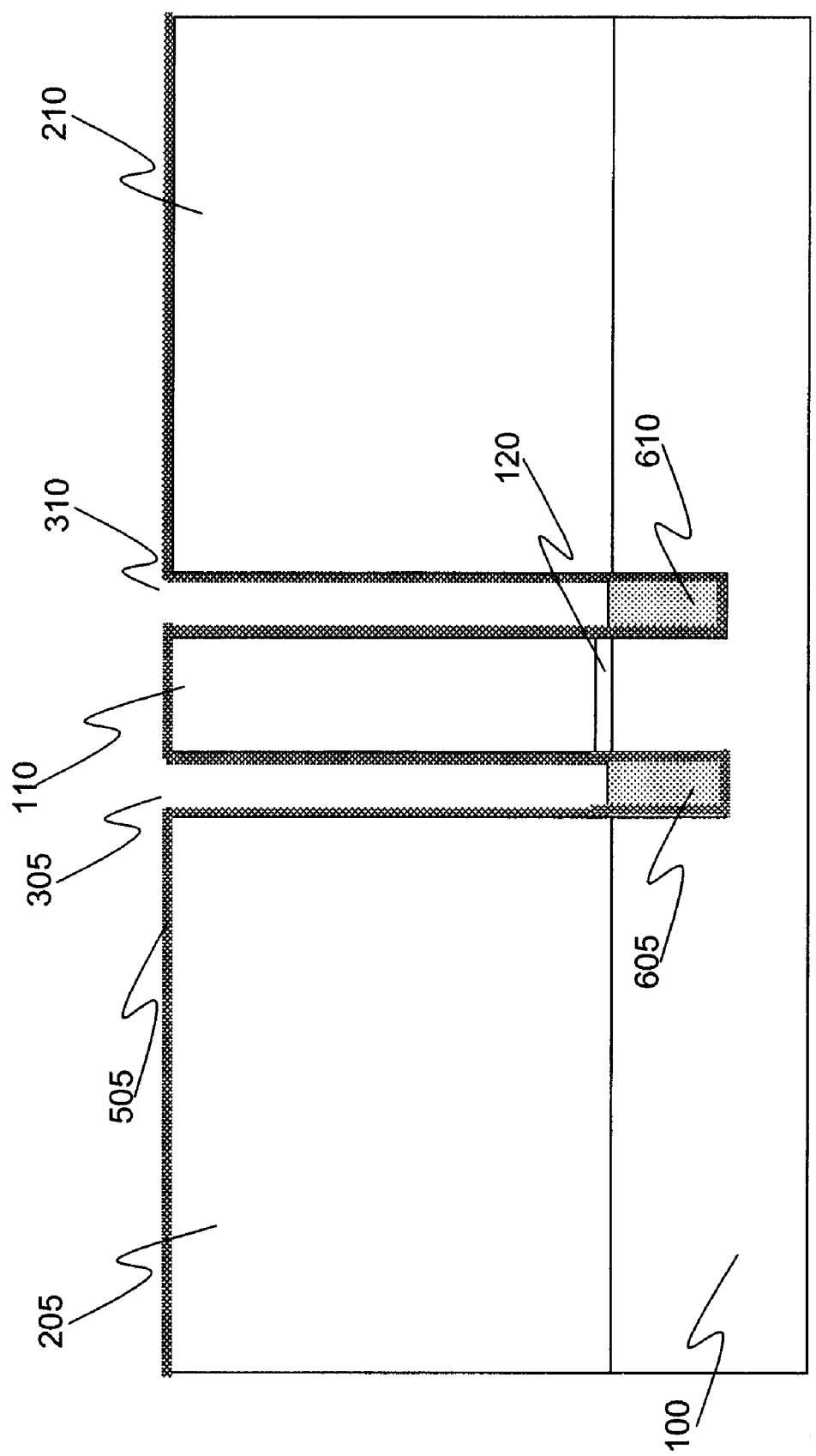
FIG. 6 shows the semiconductor structure of FIG. 5 with stress inducing material formed in the recesses.

Next recesses 405 and 410 may be filled with stress inducing material 605 and 610, as shown in FIG. 6. The stress inducing material may fill the recesses 405 and 410 up to about the top of the substrate 100. Materials that undergo a volume expansion during the process flow may be used to impart compressive stresses. Likewise, materials that undergo a volume contraction during the process flow may be used to impart tensile stresses. Alternatively, materials having intrinsic stress properties may be used to impart tensile or compressive stresses. Thus, the chosen materials should impart a determined stress (e.g., either compressive or tensile) without introducing adverse affects.

An example of a tensile material is polysilicon. Polysilicon may be deposited in a conventional manner, such as by pyrolizing silane ($SiH_4$) using a low-pressure reactor operated between about 600° C. and 650° C. The pressure may be approximately 25 to 130 Pa using 100% silane or 20% to 30% silane diluted in nitrogen. After deposition, the polysilicon may be annealed, such as by rapid thermal annealing (RTA) between 950 to 1050° C. Upon annealing, the polysilicon grains grow and the material experiences a volume contraction. The contraction creates a tensile stress. The tensile stress causes tension in the channel, which enhances electron mobility for an nFET.

An example of a material which may impose a compressive stress is $Si_{1-x}Ge_x$, which may be deposited or grown using conventional techniques such as chemical vapor deposition methods. For example, ultrahigh vacuum chemical vapor deposition (UHVCVD) may be used to grow a device quality $Si_{1-x}Ge_x$ layer. Other conventional techniques include rapid thermal chemical vapor deposition (RTCVD), low-pressure chemical vapor deposition (LPCVD), limited reaction processing CVD (LRPCVD) and molecular beam epitaxy (MBE).

Another example of a material which may impose a compressive stress is $SiO_2$. When Si is oxidized such as at a high temperature, dense Si is replaced with less dense SiO. The $SiO_2$ is expanded in volume relative to the Si and exerts a compressive stress.

Alternatively, dielectric films may be used to stress recesses 405 and 410. By way of example, silicon nitride $Si_3N_4$ or $Si_xN_y$, and/or silicon oxynitride $Si_xON_y$, may be used for stress films. These materials may be grown or blanket deposited in a conventional manner, such as by chemical vapor deposition (CVD), plasma enhanced CVD or physical vapor deposition (PVD). Such films can be made with a well controlled thickness. Illustratively, the thickness range may be between 50 to 300 nanometers for a thick film, and 20 to 50 nanometers for a thin film. Stress in such films may be controlled by controlling the deposition pressure and/or plasma power and/or other deposition process parameters.

Illustratively, without limiting the scope of the invention, to achieve a tensile film exhibiting a tensile stress of approximately 700 MPa, the following CVD parameters may be used: (i) a temperature of approximately 480° C., (ii) a pressure of approximately 6.25 Torr, (iii) a spacing between the wafer and the electrode of 490 mils, (iv) a flow of 300 sccm of 2% dilute $SiH_4$ gas, 15 sccm $NH_3$ gas and 1060 sccm $N_2$ gas using RF power of 340 watts.

Likewise, without limiting the scope of the invention, to achieve a compressive film exhibiting a compressive stress of approximately −1400 MPa, the following CVD parameters may be used: (i) a temperature of approximately 480° C., (ii) a pressure of approximately 5.75 Torr, (iii) a spacing between the wafer and the electrode of 395 mils, (iv) a flow of 3000 sccm of 2% dilute $SiH_4$ gas, 15 sccm $NH_3$ gas and 1060 sccm $N_2$ gas using RF power of 900 watts. Adjusting the deposition process parameters allows control over properties of the deposited material, including physical properties such as stress properties.

Figure 7:
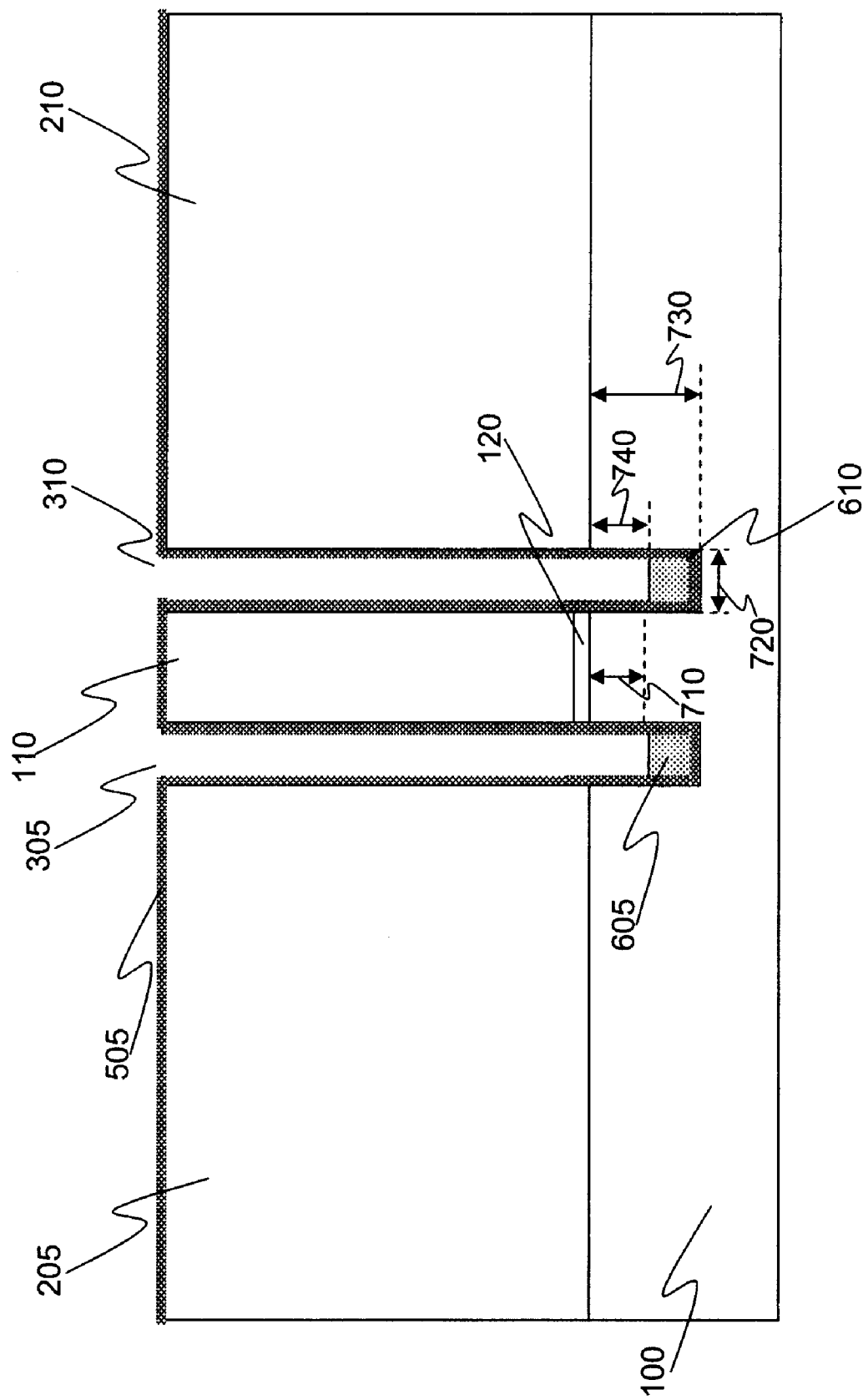
FIG. 7 shows the semiconductor structure of FIG. 6 with the stress inducing material formed in the recesses being etched back.

The stress inducing material 605 and 610 may then be selectively etched back, as shown in FIG. 7, using a conventional wet or dry timed etching process. The etching process and etchant should be selective to the material to be etched rather than the surrounding material (e.g., $Si_3N_4$ film and/or material underlying $Si_3N_4$ film). Etching should be carried out until the top surface of the material 605 and 610 is below the level of the channel, which will separate the source from the drain.

The dotted line marked by arrow 710, as shown in FIG. 7, conceptually denotes a bottom of a channel area for illustrative purposes. The area between the dotted line and the top surface of the substrate under the gate is referred to herein as the channel region or channel area. Channel regions are typically rectangular with an associated length and width. As used herein channel area refers to an actual channel as well as to an area of a substrate that will accommodate a channel when the channel is formed. Stress induced by the materials 605 and 610 will be imparted to the adjacent channel region, thereby enhancing mobility in the channel. Because the stress material is below the channel (i.e., at a greater depth in the substrate), it should not interfere with the source or drain. The width of each recess, shown as 720 in FIG. 7, is approximately the same as the width of the removed dummy spacers. By way of example, the width may be approximately 100 to 1000 Å. The total depth of each recess below the substrate 100 surface, shown as 730, may, for example, be approximately 500 to 2000 Å. The depth of the recessed stress material, i.e., the distance from the top surface of the substrate 100 to the top surface of the recessed stress material, which is denoted by 740, is slightly greater than the depth of the bottom of the channel, as denoted by 710. The height of the recessed stress material equals the difference between 730 and 740.

Additionally, as the stress inducing materials 605 and 610 are located below the dummy spacers, they are self-aligned, i.e., equidistant from the channel center. Thus, the materials 605 and 610 may impart substantially equal stresses to the channel.

The invention thus enables introduction of tensile or compressive stress to a transistor channel. Depending upon the surface orientation of the substrate and the direction of current flow in the crystal, an introduced tensile stress may enhance or degrade the mobility and an introduced compressive stress may enhance or degrade mobility.

Figure 8:
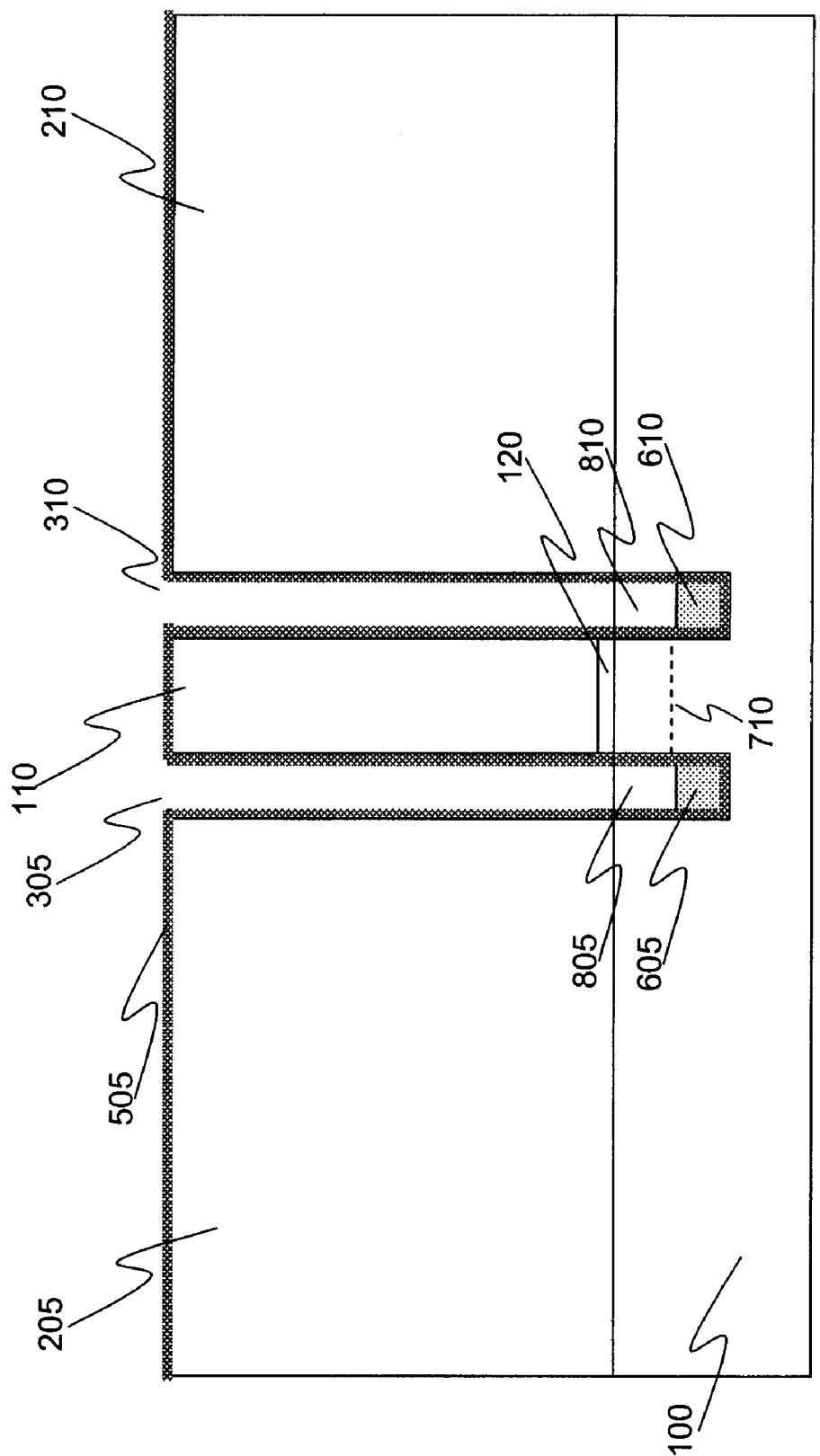
FIG. 8 shows the semiconductor structure of FIG. 7 with device quality epitaxially grown semiconductor material filling the top unfilled portion of the recesses.

After the stress inducing materials 605 and 610 have been deposited and etched back, a selective epitaxial Si growth process is carried out to fill the remainder of the recesses with device quality Si 805 and 810 as shown in FIG. 8. The epitaxial growth may be carried out using conventional vapor-phase epitaxy (VPE) or molecular beam epitaxy (MBE) techniques. The top surfaces of the epitaxially grown Si 805 and 810 may or may not be planarized.

Figure 9:
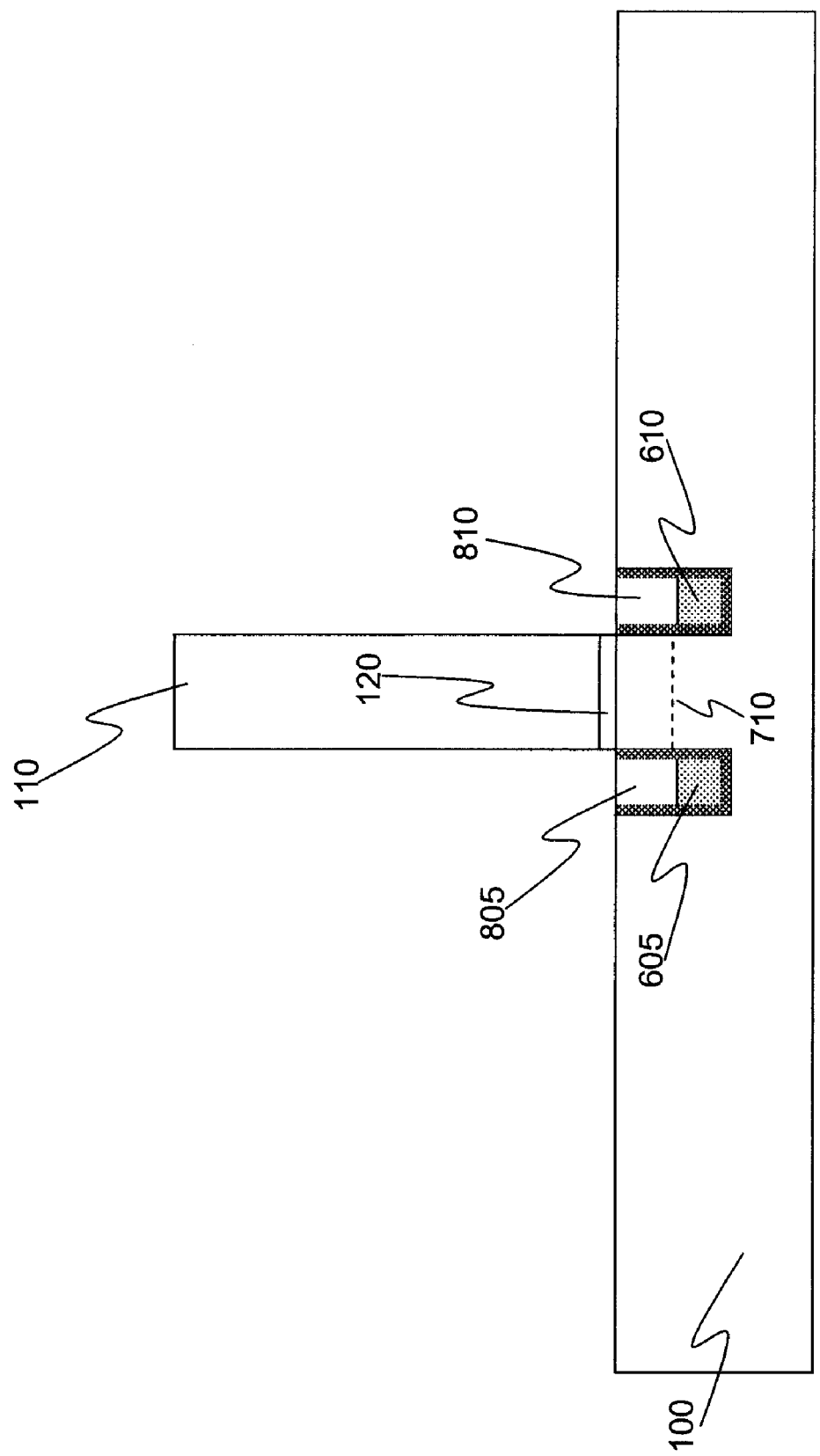
FIG. 9 shows the semiconductor structure of FIG. 8 with the mandrel layer removed.

Next, the dielectric masks 205 and 210, including exposed portions of the nitride film 505, are removed selectively with respect to the gate and substrate. A wet or dry etching process may be carried out in a conventional manner. For example, a buffered HF etch may be performed to remove the materials. Removal results in a structure as shown in FIG. 9. After such removal, a conventional process flow may be carried out to complete the device build, including halo and extension implants, source-drain spacer, source drain implants, rapid thermal annealing (RTA) and silicide formation.

Those skilled in the art will appreciate that the process described above may be carried out in a selective manner. Active devices may be categorized into two or more groups. For example, different types of devices (e.g., nFETs and pFETs) may each have their own group. Conventional masking processes may be performed to isolate one or more groups from the process, while the process is carried out on an exposed group. Thus, a process according to the principles of the invention may be carried out separately for each group, e.g., first on pFETs, then on nFETs, or vice versa, to selectively introduce compressive or tensile stresses.

Those skilled in the art will also appreciate that a process according to the principles of the invention may be carried out in conjunction with other stress inducing processes to further enhance performance. Electron mobility and, thus, nFET performance is improved by imparting tensile stress either along (i.e., parallel to) the direction of a current flow (i.e., from source to drain) and/or orthogonal to the direction of current flow. Additionally, hole mobility and, thus, pFET performance, may be enhanced by imparting compressive stress parallel to the direction of current flow and tensile stress perpendicular to the direction of current flow. To achieve enhanced performance, processes tailored to impart determined stresses orthogonal to the direction of current flow may be applied along with a process according to the principles of the invention.

Additionally, those skilled in the art will appreciate that in some cases it may be advantageous to degrade mobility, such as to regulate current flow. The invention enables selectively introducing compress or tensile stresses for purposes of degrading mobility.

While the invention has been described in terms of exemplary embodiments, those skilled in the art will recognize that the invention can be practiced with modifications and in the spirit and scope of the appended claims.

The invention claimed is:

1. A method of forming a semiconductor structure comprising steps of:
    forming spacer voids between a gate a mandrel layer;
    creating recesses in a substrate below and in alignment with the spacer voids;
    filling a first portion of the recesses with a stress imposing material;
    filling a second portion of the recesses with a semiconductor material; and
    removing the mandrel layer.

2. A method according to claim 1, further including forming dummy spacers between the mandrel layer and the gate and forming a nitride interface as an etch stop in the recesses.

3. A method according to claim 1, wherein the recesses include a first recess and a second recess, the first recess and the second recess having a depth greater than a depth of the bottom of a channel area of the gate.

4. A method according to claim 3, wherein the first recess has a depth substantially equal to a depth of the second recess.

5. A method according to claim 3, wherein the first recess has a depth of about 500 to 2000 angstroms.

6. A method according to claim 1, further comprising forming dummy spacers and removing the dummy spacers to form the spacer voids, wherein:
    a first dummy spacer has a first width;
    a second dummy spacer has a second width;
    a first recess of the recesses has a width substantially equal to the first width of the first dummy spacer; and
    a second recess of the recesses has a width substantially equal to the second width of the second dummy spacer.

7. A method according to claim 6, wherein the first width is substantially equal to the second width.

8. A method according to claim 7, wherein the first width is about 100 to 1000 Å.

9. A method according to claim 1, wherein the recesses are substantially equidistant from the gate.

10. A method according to claim 1, wherein the stress imposing material is a material that introduces a compressive stress.

11. A method according to claim 1, wherein the stress imposing material is a material that introduces a tensile stress.

12. A method according to claim 1, wherein the stress imposing material is a material that introduces a stress that degrades electron or hole mobility in the semiconductor structure.

13. A method according to claim 1, wherein the stress imposing material is a material that introduces a stress that enhances electron or hole mobility in the semiconductor structure.

14. A method according to claim 1, wherein the stress imposing material is a material comprised of at least one of polysilicon, $SiO_2$, $Si_{1-x}Ge_x$, $Si_xN_y$, or $Si_xON_y$.

15. A method according to claim 1, wherein the semiconductor material is comprised of epitaxially grown Si.

16. A method according to claim 1, wherein: the gate is an n-channel field effect transistor gate; and the stress imposing material is a material that introduces a tensile stress in a direction parallel to a direction of current flow for the n-channel field effect transistor gate.

17. A method according to claim 1, wherein: the gate is a p-channel field effect transistor gate; and the stress imposing material is a material that introduces a compressive stress in a direction parallel to a direction of current flow for the p-channel field effect transistor gate.

18. A method according to claim 1, further comprising a step of annealing after filling the first portion of the recesses with the stress imposing material.

19. A method of forming a semiconductor structure comprising steps of:
    forming dummy spacers on sides of a gate formed on a substrate;
    forming a mandrel layer with portions of the mandrel layer abutting the dummy spacers;
    removing the dummy spacers to form spacer voids between the gate and the mandrel layer;
    creating recesses in the substrate below and in alignment with the spacer voids
    filling a first portion of the recesses with a stress imposing material; and
    filling a second portion of the recesses with a semiconductor material.

20. A method according to claim 19, further comprising the step of:

removing the mandrel layer,
wherein:
the first portion of the recesses is below the bottom of a channel area of the gate; and
the stress imposing material is a material that introduces one of a compressive stress and a tensile stress in the channel area.

21. A method according to claim 20, wherein the gate is one of:
an n-channel field effect transistor gate and the stress imposing material is a material that introduces a tensile stress in a direction parallel to a direction of current flow for the n-channel field effect transistor gate; and
a p-channel field effect transistor gate and the stress imposing material is a material that introduces a compressive stress in a direction parallel to a direction of current flow for the p-channel field effect transistor gate.

22. A method according to claim 19, wherein the stress imposing material is a material comprised of at least one of polysilicon, $SiO_2$, $Si_{1-x}Ge_x$, $Si_xN_y$, or $Si_xON_y$.

23. A method of forming a semiconductor structure comprising steps of:
forming a field effect transistor gate on a substrate;
forming a first dummy spacer and a second dummy spacer on sides of the field effect transistor gate;
forming a mandrel layer with portions of the mandrel layer abutting the first and second dummy spacers for the field effect transistor gate;
after masking the semiconductor structure, introducing stress to the field effect transistor gate; and
removing the mandrel layer,
wherein the step of introducing stress material comprises:
removing the first and second dummy spacers from the field effect transistor gate to form first and second spacer voids between the field effect transistor gate and the portions of the mandrel layer;
creating a first recess in the substrate below and in alignment with the first spacer void and a second recess in the substrate below and in alignment with the second spacer void for the field effect transistor gate;
filling a first portion of the first recess and a first portion of the second recess with a stress imposing material configured to enhance performance of the field effect transistor gate;
filling a second portion of the first recess and a second portion of the second recess for the field effect transistor gate with a semiconductor material; and
unmasking the semiconductor structure.

24. A method according to claim 23, wherein the steps are performed in the order recited.

25. A method according to claim 23, wherein one of:
the field effect transistor gate is an n-channel field effect transistor gate and the stress imposing material configured to enhance performance of the n-channel field effect transistor gate is a material that introduces a tensile stress in a direction parallel to a direction of current flow for the n-channel field effect transistor gate; and
the field effect transistor gate is a p-channel field effect transistor gate and the stress imposing material configured to enhance performance of the p-channel field effect transistor gate is a material that introduces a compressive stress in a direction parallel to a direction of current flow for the n-channel field effect transistor gate.

26. A method according to claim 23, wherein the stress imposing material is a material that introduces a compressive stress.

27. A method according to claim 23, wherein the stress imposing material is a material that introduces a tensile stress.

28. A method according to claim 23, wherein the stress imposing material is a material that introduces a stress that degrades electron or hole mobility in the semiconductor structure.

29. A method according to claim 23, wherein the stress imposing material is a material that introduces a stress that enhances electron or hole mobility in the semiconductor structure.

30. A method according to claim 23, wherein the stress imposing material is a material comprised of at least one of polysilicon, $SiO_2$, $Si_{1-x}Ge_x$, $Si_xN_y$, or $Si_xON_y$.

31. A method according to claim 23, wherein the semiconductor material is comprised of epitaxially grown Si.

32. A method of providing compressive or tensile imposing materials selectively beneath and in alignment with spacer areas of a semiconductor substrate and adjacent to channel areas to enhance electron and hole mobility in CMOS circuits, comprising:
forming disposable dummy spacers on the semiconductor substrate and adjacent to the channel areas of a patterned gate;
forming a mandrel over active device regions of the patterned gate, abutting the disposable dummy spacers;
after forming of the mandrel, removing the disposable dummy spacers to form spacer voids;
etching recesses into the semiconductor substrate at a bottom of the spacer voids;
introducing a compressive or tensile imposing material into a portion of the recesses; and
filling a remainder of the recesses with material.

33. The method of claim 32, wherein the compressive or tensile imposing material fill the recesses up to about a surface of the semiconductor substrate.

34. The method of claim 33, wherein:
the compressive imposing material undergoes a volume expansion to impart compressive stresses; and
the tensile imposing material undergoes a volume contraction to impart tensile stresses.

35. The method of claim 32, wherein a depth of the recesses are approximately 500 to 2000 Angstroms.

36. The method of claim 32, wherein the recesses are partially filled with the compressive or tensile imposing material.

37. The method of claim 32, wherein the disposable dummy spacers are comprised of a nitride.

38. The method of claim 32, wherein the disposable dummy spacers are comprised of a $SiO_2$ liner and a polysilicon film.

39. The method of claim 32, wherein the mandrel is comprised of a dielectric film or a self-planarizing material that withstands etching of the disposable dummy spacers.

40. The method of claim 32, further comprising forming a nitride interface in the recesses.

41. The method of claim 32, wherein:
the tensile imposing material is a dielectric film or polysilicon which is annealed by rapid thermal annealing (RTA) between 950 to 1050° C. such that polysilicon grains grow and experience a volume contraction to create a tensile stress; and
the compressive imposing material is a dielectric film, $Si_{1-x}Ge_x$ or $SiO_2$.

* * * * *